(12) United States Patent
Hung et al.

(10) Patent No.: US 12,166,026 B2
(45) Date of Patent: Dec. 10, 2024

(54) SEMICONDUCTOR PACKAGES AND METHODS FOR FORMING THE SAME

(71) Applicant: TAIWAN SEMICONDUCTOR MANUFACTURING COMPANY, LTD., Hsinchu (TW)

(72) Inventors: Han-Tang Hung, ShinChu (TW); Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/229,670

(22) Filed: Aug. 3, 2023

(65) Prior Publication Data

US 2023/0378148 A1 Nov. 23, 2023

Related U.S. Application Data

(62) Division of application No. 17/475,020, filed on Sep. 14, 2021, now Pat. No. 11,901,349.

(60) Provisional application No. 63/188,017, filed on May 13, 2021.

(51) Int. Cl.
*H01L 25/18* (2023.01)
*H01L 21/78* (2006.01)
*H01L 23/00* (2006.01)
*H01L 23/538* (2006.01)
*H01L 25/00* (2006.01)

(52) U.S. Cl.
CPC ............ *H01L 25/18* (2013.01); *H01L 21/78* (2013.01); *H01L 23/5386* (2013.01); *H01L 24/16* (2013.01); *H01L 24/73* (2013.01); *H01L 24/94* (2013.01); *H01L 25/50* (2013.01); *H01L 2224/16225* (2013.01); *H01L 2224/73204* (2013.01)

(58) Field of Classification Search
CPC ...... H01L 25/18; H01L 21/78; H01L 23/5386
See application file for complete search history.

(56) References Cited

U.S. PATENT DOCUMENTS

| | | |
|---|---|---|
| 6,150,724 A | 11/2000 | Wenzel et al. |
| 8,802,504 B1 | 8/2014 | Hou et al. |
| 8,803,292 B2 | 8/2014 | Chen et al. |
| 8,803,316 B2 | 8/2014 | Lin et al. |

(Continued)

*Primary Examiner* — Errol V Fernandes
(74) *Attorney, Agent, or Firm* — NZ CARR LAW OFFICE

(57) ABSTRACT

Embodiments of the present disclosure provide a semiconductor package. In one embodiment, the semiconductor package includes a first integrated circuit die having a first circuit design, and the first integrated circuit die comprises a first device layer and a first interconnect structure. The semiconductor package also includes a second integrated circuit die having a second circuit design different than the first circuit design, and the second integrated circuit die comprises a second device layer and a second interconnect structure having a first side in contact with the first device layer and a second side in direct contact with the first interconnect structure of the first integrated circuit die. The semiconductor package further includes a substrate having a first side bonded to the first interconnect structure, wherein the second integrated circuit die is surrounded by at least a portion of the substrate.

20 Claims, 11 Drawing Sheets

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2018/0350731 A1* | 12/2018 | Hu .................... H01L 23/49838 |
| 2020/0365481 A1 | 11/2020 | England et al. |

* cited by examiner

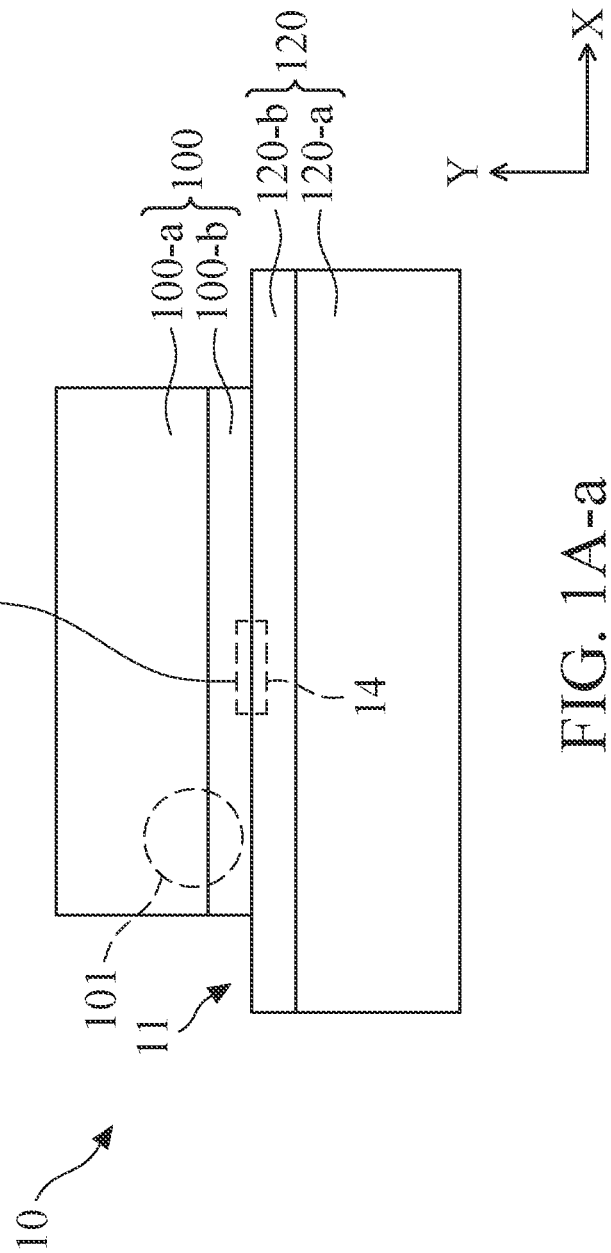

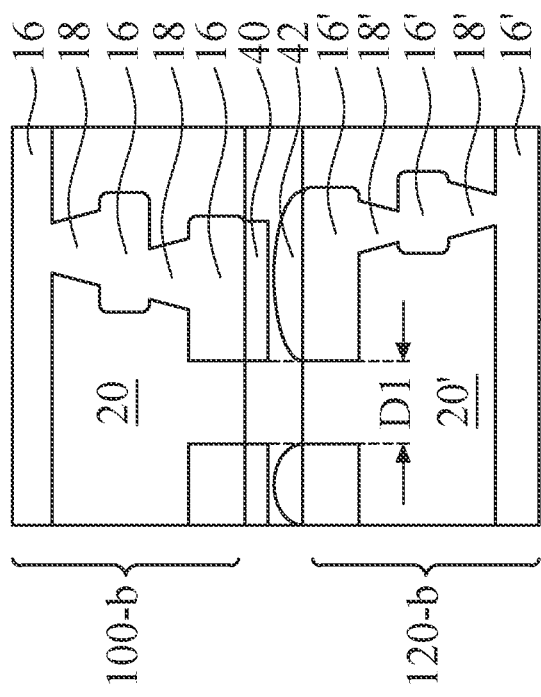
FIG. 1A-d
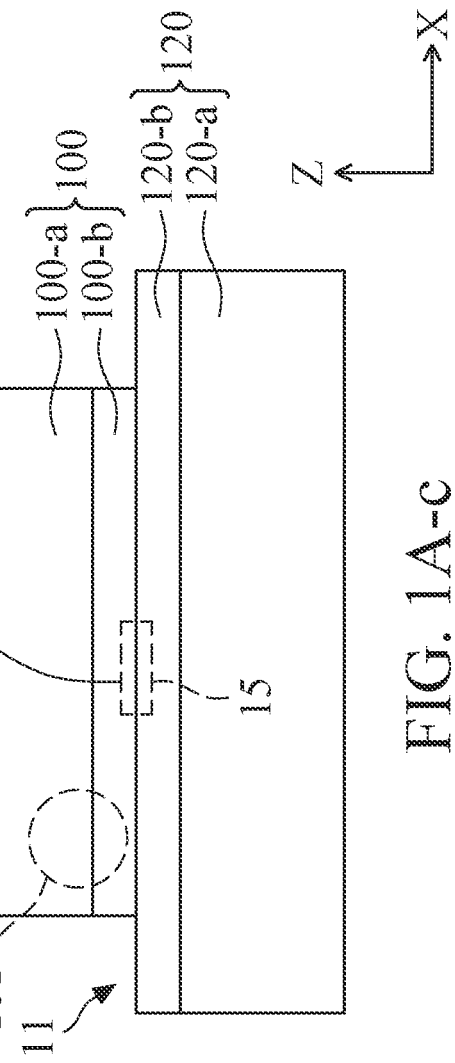
FIG. 1A-c

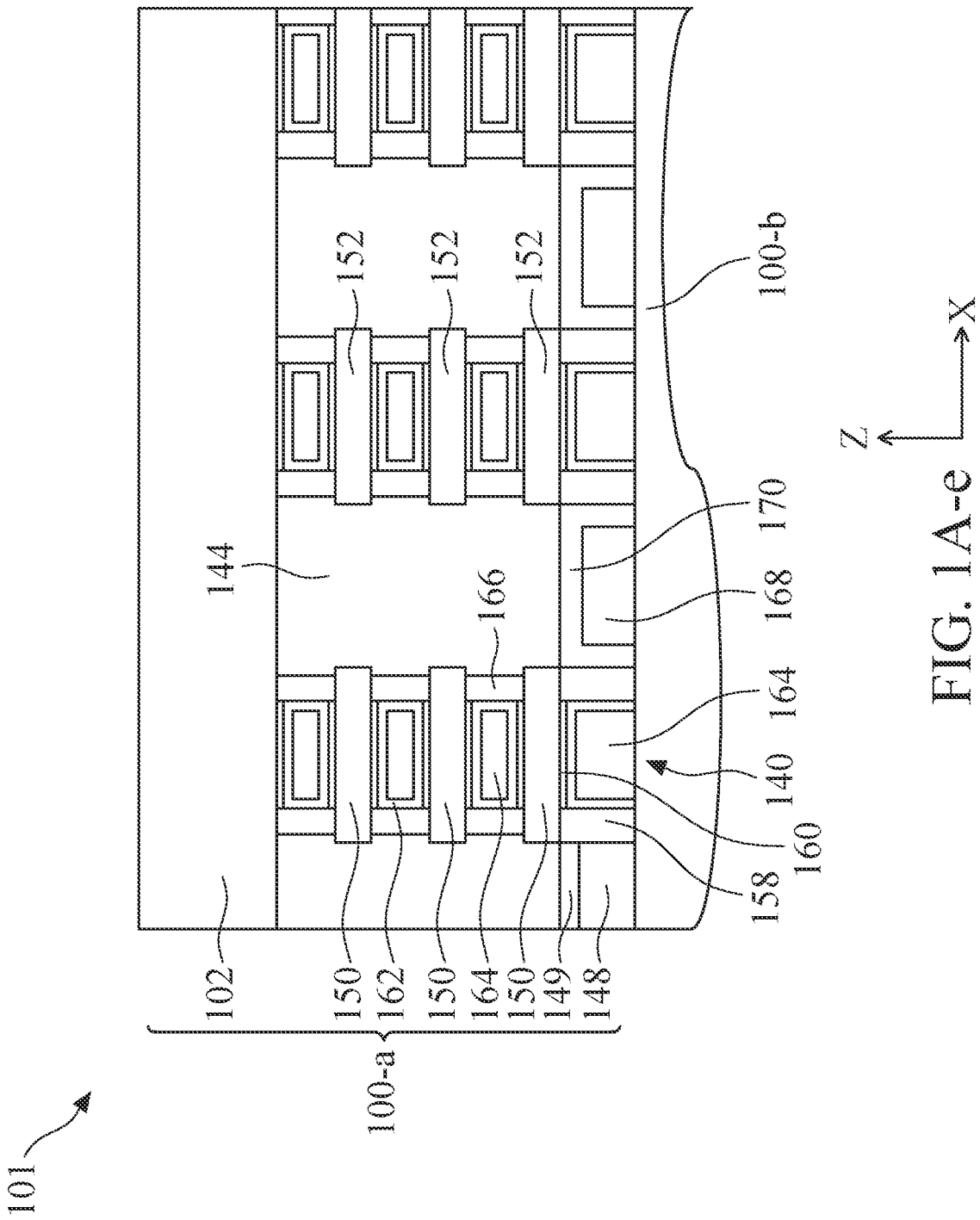
FIG. 1A-e

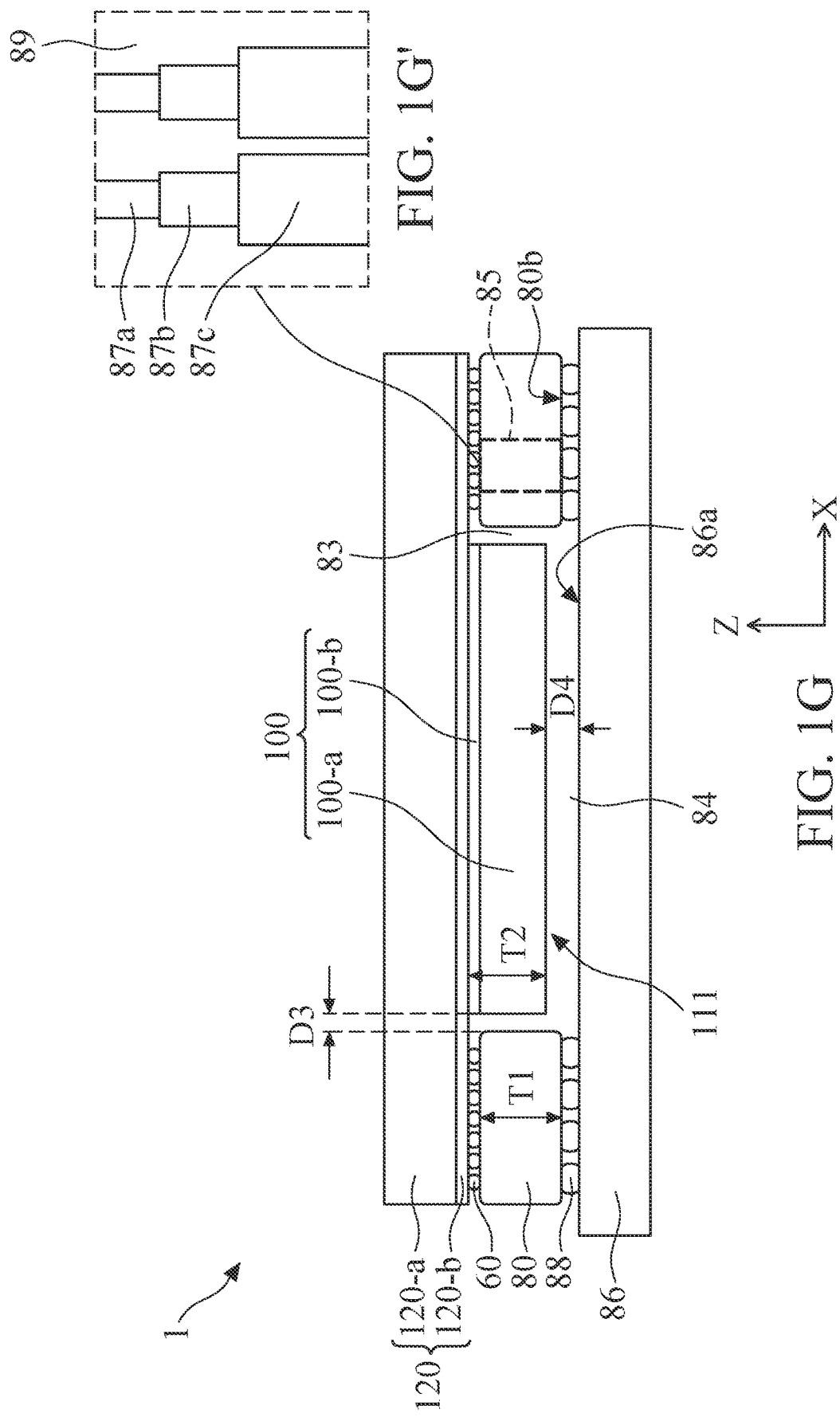

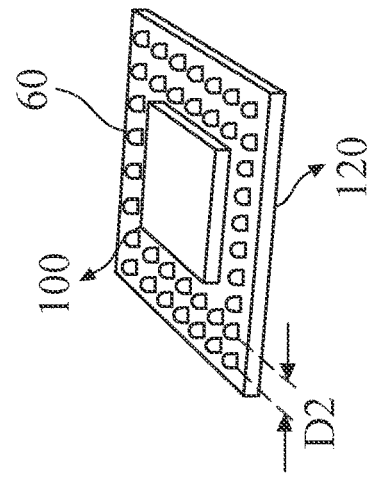
FIG. 2A
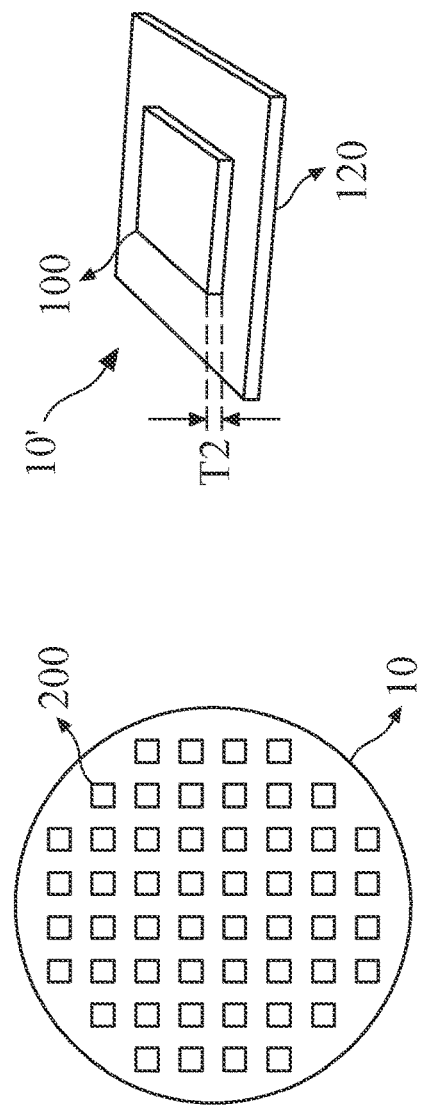
FIG. 2B
FIG. 2C
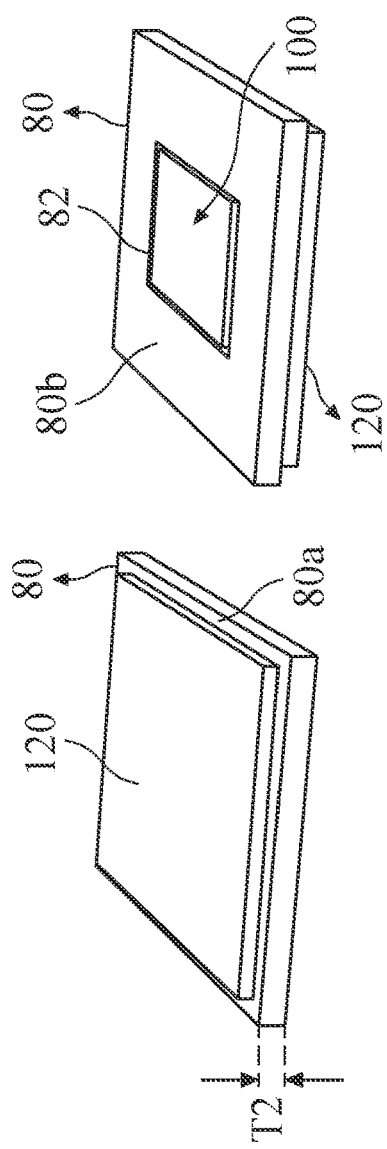
FIG. 2D
FIG. 2E
FIG. 2F

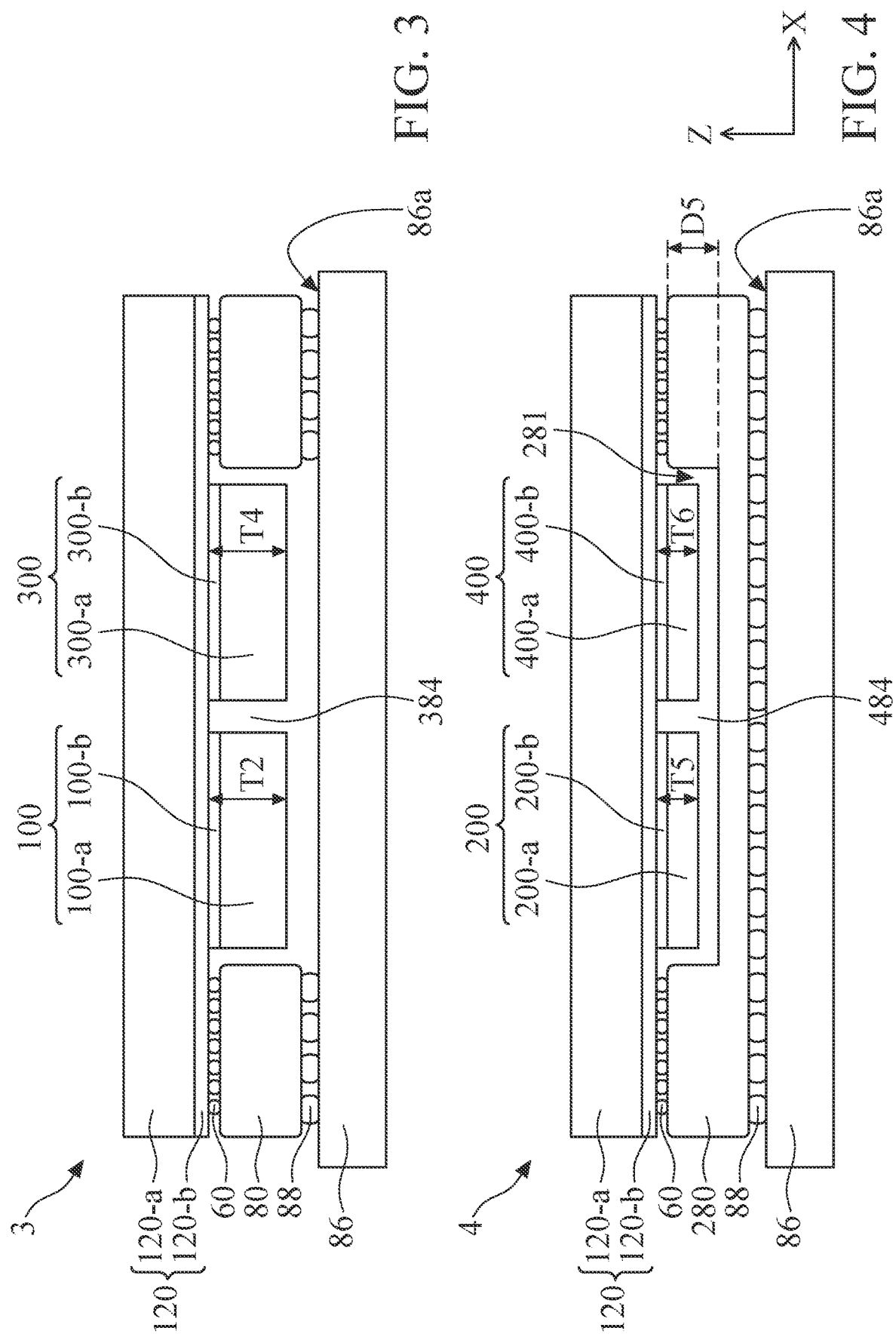

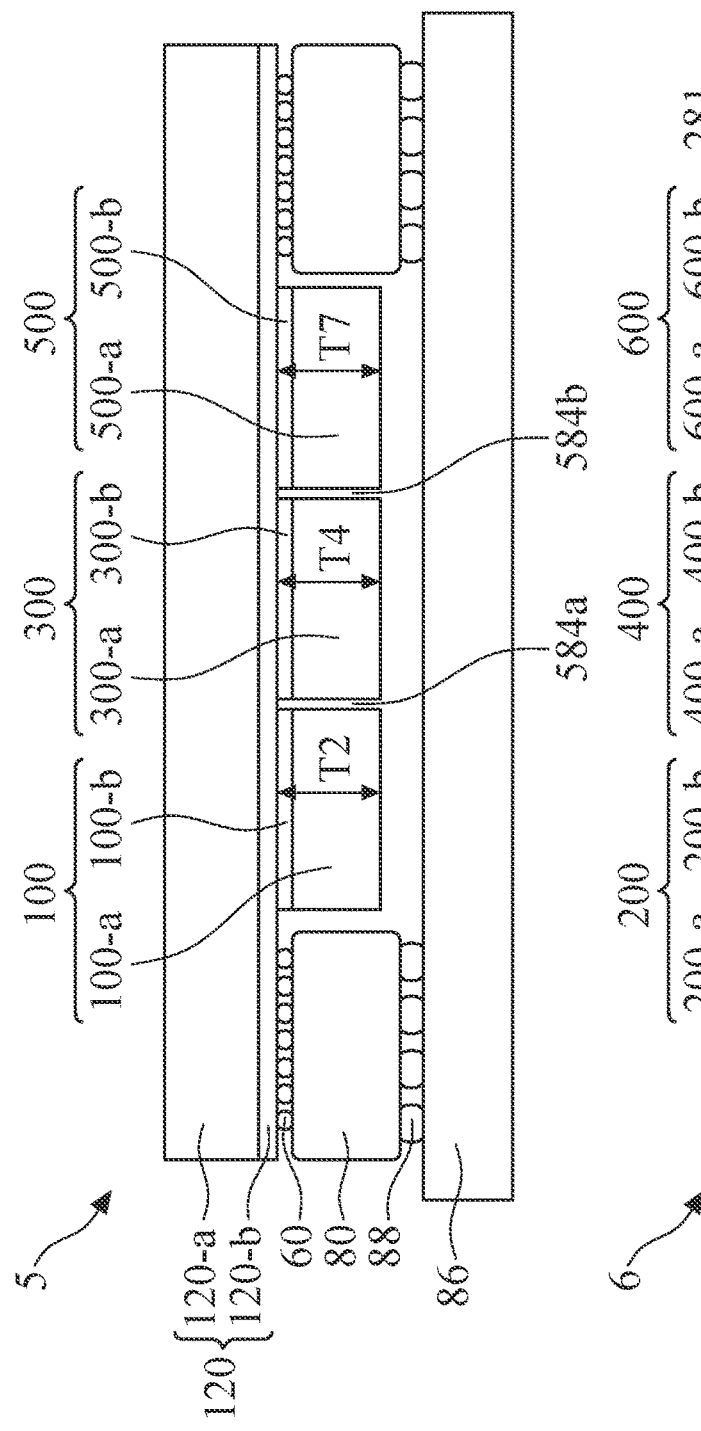
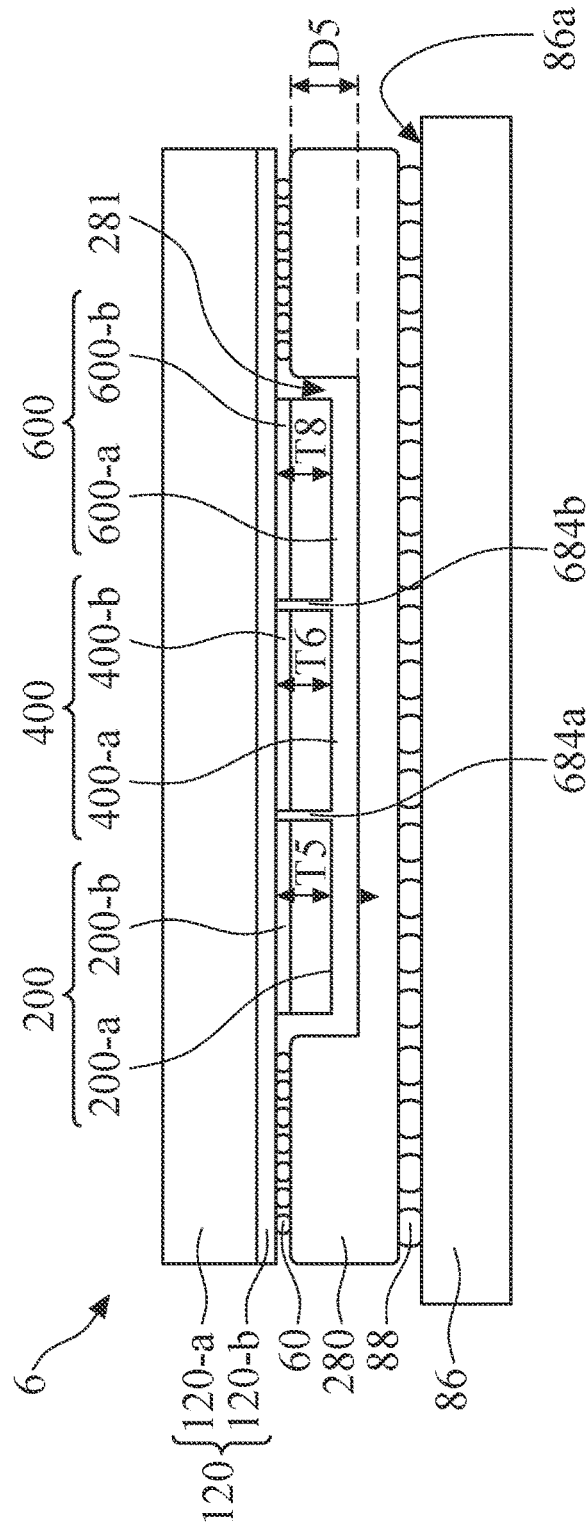

SEMICONDUCTOR PACKAGES AND METHODS FOR FORMING THE SAME

CROSS-REFERENCE TO RELATED APPLICATIONS

This application is a divisional application of U.S. patent application Ser. No. 17/475,020 filed on Sep. 14, 2021, which claims a priority to a U.S. provisional patent application Ser. No. 63/188,017 filed on May 13, 2021, which are incorporated by reference in its entirety.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area, forming integrated circuit dies. Each integrated circuit die may include many input/output pads to communicate with other components to be packaged with the integrated circuit die. Interposers are commonly used to provide input/output among two or more integrated circuit dies in a semiconductor package. However, integration density increases, connecting integrated circuit dies through interposers alone may become challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1G schematically demonstrate various stages of forming a semiconductor package according to embodiments of the present disclosure.

FIG. 1A-a illustrates a cross-sectional view of a portion of the wafer and the integrated circuit die along the line 1A-a-1A-a shown in FIG. 1A, in accordance with some embodiments.

FIG. 1A-b is an enlarged view showing a portion of the interconnect structures in accordance with some embodiments.

FIG. 1A-c is a cross-sectional view of a portion of the wafer and the integrated circuit die along the line 1A-c-1A-c shown in FIG. 1A-a according to embodiments of the present disclosure.

FIG. 1A-d is an enlarged view showing a portion of the interconnect structures in accordance with some embodiments.

FIG. 1A-e is a cross-sectional view of an enlarged view of a portion of the integrated circuit die shown in FIGS. 1A-a and 1A-c in accordance with some embodiments.

FIG. 1G' illustrates an enlarged view of a portion of the substrate showing an exemplary arrangement of the conductive paths in accordance with some embodiments.

FIGS. 2A-2G schematically demonstrate various stages of forming a semiconductor package according to an alternative embodiment of the present disclosure.

FIG. 3 illustrates a cross-sectional view of a semiconductor package according to some embodiments of the present disclosure.

FIG. 4 illustrates a cross-sectional view of a semiconductor package according to some embodiments of the present disclosure.

FIG. 5 is a cross-sectional view of a semiconductor package according to some embodiments of the present disclosure.

FIG. 6 is a cross-sectional view of a semiconductor package according to some embodiments of the present disclosure.

DETAILED DESCRIPTION

Figure 1A:
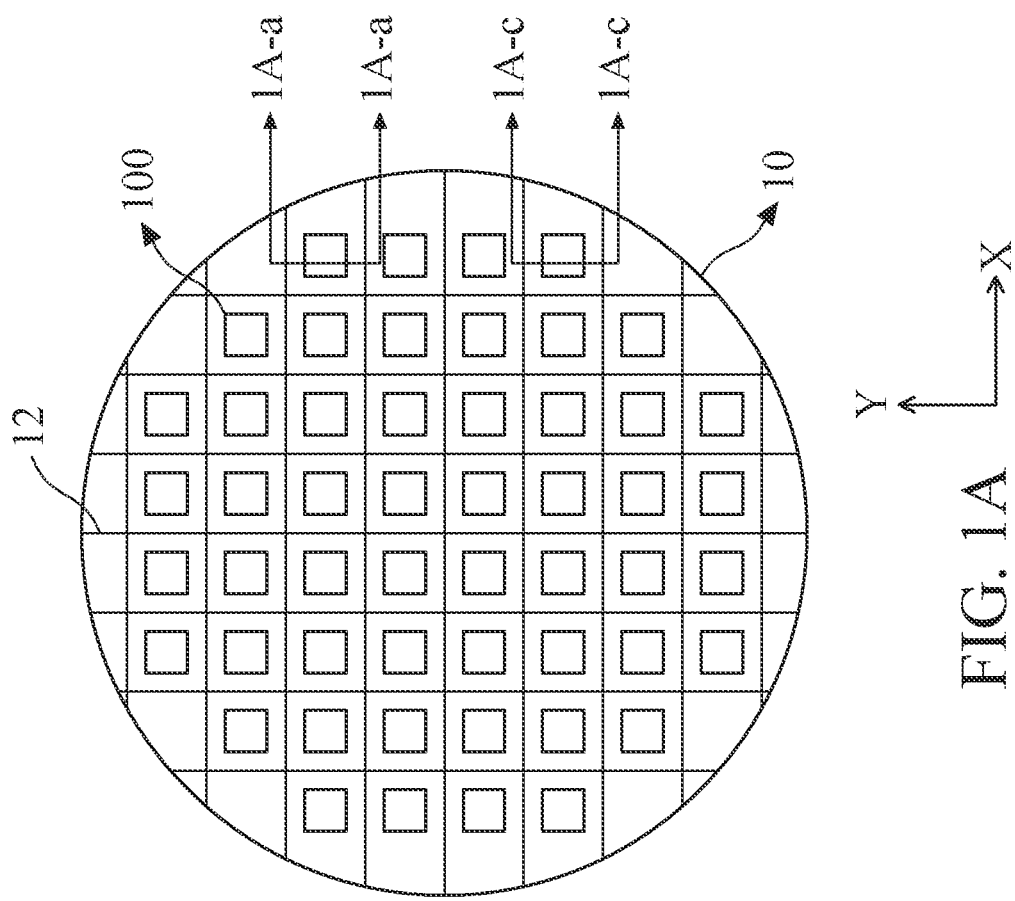

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure may be discussed in a specific context, namely a package structure (e.g., a package on package (PoP) structure) including dies bonded together with a hybrid bonding technique. The dies can be bonded together face-to-face (F2F) or face-to-back (F2B). For example, in a F2F bonding configuration the active surfaces (faces) of the dies are bonded together, whereas in a F2B bonding configuration, an active surface of one die is bonded to a back surface of another die. In addition, the hybrid bonding between the dies includes a dielectric-to-dielectric bonding and a metal bonding (e.g., BEOL-BEOL direct bonding). Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Further, the teachings of this disclosure are applicable to any package structure including one or more semiconductor dies. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

Various embodiments of the present disclosure provide a semiconductor package structure including direct BEOL-BEOL bonding of one or more integrated circuit dies to have shorter communication distance and enable heterogeneous integration. In one embodiment, a plurality of first set of integrated circuit dies are fabricated and bonded to a processed wafer having a plurality of second set of integrated circuit dies formed thereon. Each first and second set of integrated circuit dies may include a device layer and an interconnect structure in contact with the device layer. The interconnect structure may include multiple levels of conductive features arranged to provide electrical paths to various semiconductor devices in the device layer. The plurality of first set of integrated circuit dies may have different circuit design than that of the plurality of second set of integrated circuit dies. After fabrication of the plurality of first set of integrated circuit dies, the first set of integrated circuit dies are tested and cut into pieces and bonded to the wafer through a direct BEOL-BEOL bonding technology (e.g., interconnect structures of the first set of integrated circuit dies are in direct contact with the interconnection structure of the corresponding second set of integrated circuit dies formed on the wafer). The processed wafer with the plurality of first set of integrated circuit dies is cut into individual wafer pieces each having one or more first set of integrated circuit dies bonded to the corresponding second set of integrated circuit die. The individual wafer piece is then bonded to a substrate, which surrounds the integrated circuit dies at a distance. Next, the substrate is connected to a printed circuit board (PCB) by a bumping process to enable direct connection between one or more integrated dies without using an interposer, embedded bridges, or a redistribution layer (RDL). Embodiments of the present disclosure therefore provide new approach for heterogeneous integration in BEOL architecture. Details of various embodiments are further discussed with respect to FIGS. 1A-7.

FIGS. 1A-1G schematically demonstrate various stages of forming a semiconductor package 1 according to embodiments of the present disclosure. FIG. 1A is a schematic plan view of a wafer 10 including an array of integrated circuit dies 100 (or chiplets) bonded thereon according to embodiments of the present disclosure. The array of integrated circuit dies 100 are separated from each other by two sets of intersecting scribe lines 12. A first set of scribe lines 12 extend along the x-direction and a second set of scribe lines 12 extend along the y-direction. The scribe lines 12 between the integrated circuit dies 100 may be filled with suitable dielectric material. In the embodiment shown in FIG. 1A, the integrated circuit dies 100 are bonded to the wafer 10 (chip-to-wafer) within an array of areas defined by the scribe lines 12.

The wafer 10 may be a processed wafer having a plurality of integrated circuit dies formed thereon. Each integrated circuit die may be designed to perform any suitable function. For example, each integrated circuit die may be a logic die (e.g., central processing unit, a System-on-Chip (SOC) die, ASIC, FPGA, microcontroller, etc.), a memory die (e.g., a DRAM die, a Wide I/O die, a M-RAM die, a R-RAM die, a NAND die, an SRAM die, etc.), a memory cube (e.g., HBM, HMC, etc.), a high data rate transceiver die, an I/O interface die, an integrated passive device die (e.g., an IPD die), a power management die (e.g., a PMIC die), an RF die, a sensor die, an MEMS die, signal processing dies (e.g., a DSP die), a front-end die (e.g., an AFE dies), a monolithic 3D heterogeneous chiplet stacking die, or the like. Each of the integrated circuit dies 100 may be a SOC die or a memory die. In one exemplary embodiment, the integrated circuit dies on the processed wafer 10 are logic dies and the integrated circuit dies 100 are memory dies. In some embodiments, the integrated circuit dies 100 may include two or more different circuit designs. For example, a first set of integrated circuit dies 100 may have a first circuit design and a second set of integrated circuit dies 100 may have a second circuit design different than the first circuit design in order to achieve different functions. The integrated circuit dies on the processed wafer 10 may have a third circuit design different than that of the first and second sets of integrated circuit dies. The first and second sets of integrated circuit dies may have the same or different heights and/or dimensions. FIGS. 3-6 illustrate embodiments where two or more integrated circuit dies 100 with different circuit designs are bonded to the wafer 10, as will be discussed in more detail below.

FIG. 1A-a illustrates a cross-sectional view of a portion of the wafer 10 and the integrated circuit die 100 along the line 1A-a-1A-a shown in FIG. 1A, in accordance with some embodiments. The integrated circuit die 100 generally includes a device layer 100-$a$ and an interconnect structure 100-$b$ formed on a side of the device layer 100-$a$ by various semiconductor fabrication processes, including, but not limited to, front-end-of-line (FEOL) processes and back-end-of-line (BEOL) processes. Likewise, the integrated circuit die 120 includes a device layer 120-$a$ and an interconnect structure 120-$b$ formed on the device layer 120-$a$ by various semiconductor fabrication processes. The device layer 100-$a$ and the device layer 120-$a$ may include various semiconductor devices, such as transistors, diodes, capacitors, resistors, etc. The interconnect structure 100-$b$ and the interconnect structure 120-$b$ may include various conductive features, such as single or dual damascene structures, conductive vias and conductive lines, and one or more intermetal dielectric layers to separate and isolate various neighboring conductive vias and lines. The interconnect structure 100-$b$ and 120-$b$ may each include multiple levels of the conductive features arranged in each level to provide electrical paths to various devices in the device layer 120-$a$. For example, the interconnect structures 100-$b$ may include conductive lines 16 and conductive vias 18, formed in a dielectric structure 20. The conductive vias 18 provide vertical electrical routing from the device layer 100-$a$ to the conductive lines 16, and between the conductive lines 16 in different layers. The interconnect structure 100-$b$ may be formed sequentially layer-by-layer from the device layer 100-$a$ during BEOL processing. In some embodiments, the conductive lines 16 and conductive vias 18 may be fabricated using damascene and/or dual-damascene process. Likewise, the interconnect structure 120-$b$ may include conductive lines 16' and conductive vias 18' formed in a dielectric structure 20' in a similar fashion as the conductive lines 16' and conductive vias 18.

The conductive lines 16, 16' and the conductive vias 18, 18' may be made from one or more electrically conductive materials, such as metal, metal alloy, metal nitride, or silicide. Suitable materials may include, but are not limited to, copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof. The dielectric structure 20, 20' may include multiple dielectric layers embedding multiple levels of conductive lines and/or vias. The dielectric structure 20, 20' may be made from a dielectric material, such as $SiO_x$, $SiO_xC_yH_z$, SiCN, or $SiO_xC_y$, where x, y and z are integers or non-integers.

Figure 1B:
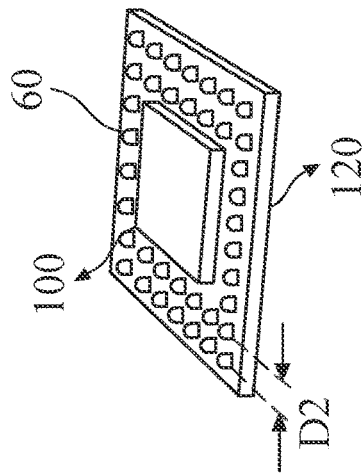

In various embodiments, the integrated circuit die 100 is bonded to an integrated circuit die 120 formed on the wafer 10 through a chip-to-wafer BEOL-BEOL bonding technology. The integrated circuit die 100 may be bonded to a first side 11 of the integrated circuit die 120 using any suitable bonding technology, such as metal-to-metal direct bonding (e.g., through micro-bumps), hybrid bonding, thermal-compression bonding and/or the like. In some embodiments, the integrated circuit die 100 and the integrated circuit die 120 are bonded together by metal-to-metal bonding without the use of a bonding layer (e.g., conductive contact pads formed in a dielectric material) or a conductive bond pad disposed between the integrated circuit die 100 and the integrated circuit die 120. In some embodiments, the interconnect structure 100-b are bonded to the interconnect structure 120-b through hybrid bonding process. In such cases, the integrated circuit die 100 and the integrated circuit die 120 are aligned so that the metal portion (e.g., conductive line 16 or via 18) of the interconnect structure 100-b is brought to contact with the metal portion (e.g., conductive line 16' or via 18') of the interconnect structure 120-b, and the dielectric portion (e.g., dielectric structure 20) of the interconnect structure 100-b is brought to contact with the dielectric portion (e.g., dielectric structure 20') of the interconnect structure 120-b. In some embodiments, the integrated circuit die 120 has a diameter larger than that of the integrated circuit die 100. The first side 11 of the integrated circuit die 200 not covered by the integrated circuit die 100 is used for bonding with other components, such as a substrate 80 (FIG. 1G) for transferring signals. For example, the exposed conductive features of the integrated circuit die 200 may be in electrical connection with the exposed conductive features of the substrate 80 through conductive bumps 60 (FIG. 1G) disposed therebetween. FIG. 1A-b illustrates an enlarged view showing a portion 14 of the interconnect structures 100-b and 120-b in accordance with some embodiments. During the hybrid bonding process, the integrated circuit die 100 and the integrated circuit die 120 are intimately in contact at room temperature by pressing the integrated circuit die 100 against the integrated circuit die 120, followed by an annealing process which heats the wafer 10 to a temperature range of about 150 degrees Celsius to about 400 degrees Celsius such that the conductive lines 16 and 16' (or conductive vias 18, 18') are interconnected by metal inter-diffusion. The pressure for hybrid bonding may be in a range from about 1 kPa to about 400 kPa.

Figure 1C:
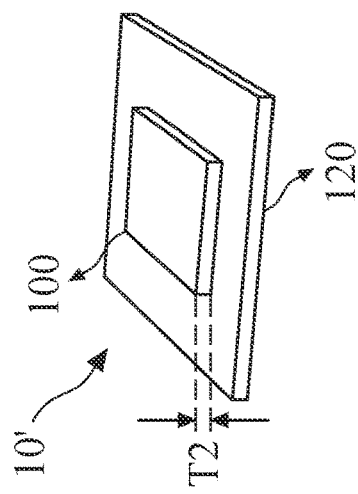

FIG. 1A-c illustrates a cross-sectional view of a portion of the wafer 10 and the integrated circuit die 100 along the line 1A-c-1A-c shown in FIG. 1A, in accordance with some embodiments. FIG. 1A-c is substantially identical to FIG. 1A-b except that a conductive layer 40 and a joint solder layer 42 are provided between the interconnect structure 100-b and the interconnect structure 120-b to enhance direct bonding of the interconnect structure 100-b to the interconnect structure 120-b. FIG. 1A-d illustrates an enlarged view showing a portion 15 of the interconnect structure 100-b and 120b in accordance with some embodiments. The conductive layer 40 may be formed directly on the conductive lines 16 and the joint solder layer 42 may be formed directly on the conductive lines 16', or vice versa. The conductive layer 40 may be a layer including pure elemental copper, copper containing unavoidable impurities, and copper alloys containing minor amounts of elements such as tantalum, indium, tin, zinc, manganese, chromium, titanium, platinum, aluminum, or zirconium. The conductive layer 40 may be formed by any suitable deposition techniques such as sputtering, printing, electroplating, electroless plating, or CVD process. In one embodiment, the conductive layer 40 is a copper pillar formed by electroplating. The size of the conductive layer 40 may range from about 1 μm to about 300 μm. In embodiments where copper pillar is adapted, the copper pillar may have a diameter ranging from about 1 μm to about 100 μm. The joint solder layer 42 may be a eutectic solder material including alloys of tin, lead, silver, copper, nickel, or combinations thereof, and may be formed by PVD or any suitable deposition technique. In some embodiments, the joint solder layer 42 is Sn—Ag—Cu (SAC) alloy. The conductive layer 40 may be first formed on the conductive lines 16 of the interconnect structure 100-b of the integrated circuit die 100. The integrated circuit die 100 is then flipped so that the conductive layer 40 formed on the conductive lines 16 of the interconnect structure 100-b is facing down. The conductive layer 40 is pressed against the joint solder layer 42 formed on the conductive lines 16' of the interconnect structure 120-b. The conductive layer 40 and the joint solder layer 42 are then bonded together through a thermal process which heats the wafer 10 to a temperature of about 150 degrees Celsius to about 400 degrees Celsius. The pressure for bonding may be in a range about 1 kPa to about 400 kPa. The bond pitch D1 between the neighboring conductive layers 40 may be in a range from about 1 μm to about 100 μm.

FIG. 1A-e is a cross-sectional view of an enlarged view of a portion 101 of the integrated circuit die 100 shown in FIGS. 1A-a and 1A-c according to embodiments of the present disclosure. In FIG. 1A-e, the device layer 100-a may include a nanostructure transistor. The term "nanostructure" is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure transistors may be referred to as nanowire/nanosheet transistors, gate-all-around (GAA) transistors, multi-bridge channel (MBC) transistors, or any transistors having a gate electrode layer surrounding channel regions. While embodiments shown in FIG. 1A-c are discussed with respect to nanostructure transistors, other devices, such as Fin-FETs, Horizontal Gate All Around (HGAA) FETs, Vertical Gate All Around (VGAA) FETs, and other suitable devices, may be adapted. A person having ordinary skill in the art will readily understand other modifications that may be made are contemplated within the scope of this disclosure.

The device layer 100-a includes gate structures 140 and epitaxial source/drain (S/D) features 144 disposed on opposite sides of the gate structure 140. A first and second stacks of semiconductor layers 150, 152, which define channel regions for the nanostructure transistor, are disposed between and in contact with the epitaxial S/D features 144, respectively. The gate structures 140 each includes gate spacers 158 formed on sidewalls of the gate structures 140, an interfacial layer (IL) 160 formed around surfaces of each semiconductor layer of the stack of semiconductor layers 150, 152, a high-k (HK) dielectric layer 162 formed around each semiconductor layer of the stack of semiconductor layers 150, 152, and a gate electrode layer 164 formed on the HK dielectric layer 162 surrounding each semiconductor layer of the stack of semiconductor layers 150, 152. An inner spacer 166 is formed between the gate electrode layer 164 and the epitaxial S/D features 144.

In one embodiment shown in FIG. 1A-e, a S/D contact 148 is disposed on a first side (e.g., front side) of the device layer 100-a. The S/D contact 148 is separated from the epitaxial S/D feature 144 by a silicide layer 149. The silicide layer 149 may be made of a metal or metal alloy. The device layer 100-a may optionally include a substrate 102 disposed on a second side (e.g., back side) of the device layer 100-a. The substrate 102 may include a semiconductor material such as, silicon (Si), germanium (Ge), silicon germanium (SiGe), or any suitable semiconductor material. An interlayer dielectric (ILD) layer 168 is disposed on the first side of device layer 100-a and separated from the epitaxial S/D features 144 by a contact etch stop layer (CESL) 170. Surfaces of portions of the S/D contact 148, the gate spacers 158, the HK dielectric layer 162, the gate electrode layer 164, the ILD layer 168, and the CESL 170 are substantially co-planar and in contact with the interconnect structure 100-b.

The interconnect structure 100-b may include a plurality of conductive vias and conductive lines, such as conductive lines 16 and conductive vias 18, and configured in a similar fashion in a dielectric material, such as the dielectric material 20 as shown in FIGS. 1A-b and 1A-d. While not shown, it is contemplated that arrangements of the devices and/or layers shown in the portion 101 are applicable to the device layer 120-a and may vary depending on the function/circuit designs of the integrated circuit die formed on the wafer 10.

In FIG. 1B, after bonding the integrated circuit dies 100 to the corresponding integrated circuit die 120 formed on the wafer 10, the wafer 10 is subject to a dicing process. The dicing process separates the individual integrated circuit dies 100 for subsequent processing, such as packaging. For ease of illustration, only one integrated circuit 100 is shown in FIG. 1B. The integrated circuit dies 100 are tested and cut out along the scribe lines 12 (FIG. 1A) to form individual wafer pieces 10' each having an integrated circuit die 120 with an integrated circuit die 100 bonded thereon. Each of the integrated circuit dies 100 may be tested by a Known-Good-Die (KGD) test or any suitable test to determine normal functionality, such that any damaged dies or dies with abnormal functionality are prevented from being selected and integrated into a desired end product. This ensures a better yield of the desired end product. In some embodiments, the KGD test is performed prior to dicing the individual integrated circuit dies 100. Additionally or alternatively, the integrated circuit dies 100 may be tested before bonding to the corresponding integrated circuit die 120 formed on the wafer 10 so that only normal and functional integrated circuit dies 100 are disposed on the wafer 10 prior to dicing into the individual integrated circuit dies 100. In some embodiments, the surface area of the integrated circuit die 100 is about 20% smaller than the surface area of the wafer 10 after the dicing process.

Figure 1D:
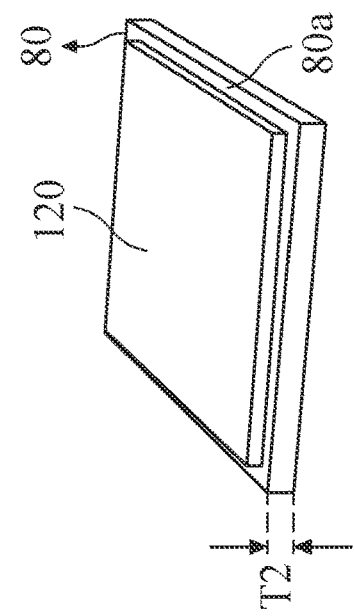

In FIG. 1C, a plurality of conductive bumps 60 are formed on the first side 11 of the integrated circuit die 120 not covered by the integrated circuit die 100. In some embodiments, the integrated circuit die 120 has an inner region where the integrated circuit die 100 is located, and an outer region at the periphery of the integrated circuit die 120 surrounding the inner region. The conductive bumps 60 may be evenly arranged in the outer region using electroplating or any suitable process such that the conductive bumps 60 are in contact with the conductive features (e.g., conductive lines) of the integrated circuit die 120. The conductive bumps 60 may be solder bumps, copper bumps, or other suitable conductive connectors that may be made to provide electrical connection between the integrated circuit die 120 and other components, such as a substrate 80 (FIG. 1D). The conductive bumps 60 are separated from each other by equal distance D2 and may be arranged around the integrated circuit die 100. In some embodiments, the distance D2 between the neighboring conductive bumps 60 may be in a range from about 10 nm to about 100 nm.

Figure 1E:
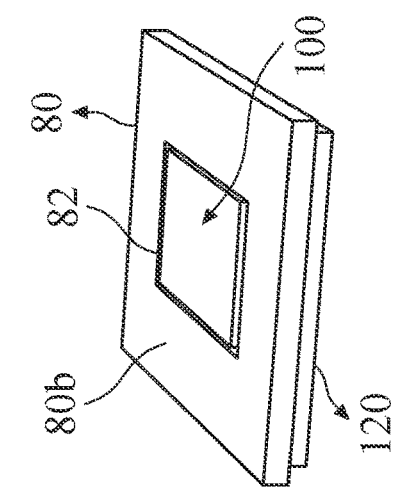
Figure 1F:
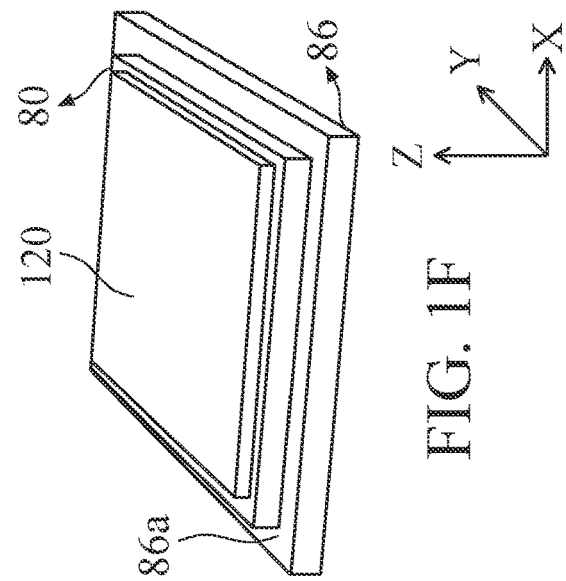

In FIGS. 1D and 1E, the integrated circuit die 120 is bonded to a substrate 80. In some embodiments, the integrated circuit die 120 is flipped over so that the conductive bumps 60 are facing down and bonded onto a first side 80a of the substrate 80. The substrate 80 may have a size corresponding to, larger, or smaller than that of the wafer 10. The substrate 80 may be a dielectric or polymer substrate having one or more conductive paths (e.g., conductive lines and/or vias) embedded therein. A polymer substrate may be advantageous as it is low cost, readily available flexible material that can absorb impact applied to the semiconductor package 100. In some embodiments, the substrate 80 comprises polyethylene terephthalate (PET) or related polyesters. The conductive paths may be formed in the substrate 80 by a screen printing process using conductive paste, a sputtering process, or any suitable technique that can be applied to polymer substrates. In some embodiments, the conductive paths may have increased dimensions in different levels of the substrate 80 along the z-direction. For example, the conductive paths with smaller dimensions may be disposed on the first side of the substrate 80 towards the integrated circuit die 120, and the conductive paths with greater dimensions may be disposed on a second side of the substrate 80 towards a printed circuit board (PCB) 86 (FIG. 1F). The conductive paths with smaller dimensions are in contact with the conductive bumps 60 having a first bump size, while the conductive paths with greater dimensions are in contact with conductive bumps 80 (FIG. 1G) having a second bump size larger than the first bump size. FIG. 1G' illustrates an enlarged view of a portion 85 of the substrate 80 showing an exemplary arrangement of the conductive paths in accordance with some embodiments. In one embodiment, the substrate 80 is formed of a polymer material 89 comprising a first conductive path 87a in contact with the conductive bump 60, a second conductive path 87b disposed between and in contact with the first conductive path 87a and a third conductive path 87c, which is disposed between in contact with the second conductive path 87b and the conductive bump 88. The first conductive path 87a has a first diameter, the second conductive path 87b has a second diameter greater than the first diameter, and the third conductive path 87c has a third diameter greater than the second diameter.

In some embodiments, the substrate 80 is a ring-like substrate having an opening or hole 82 (FIGS. 1E and 1G) formed through the thickness of the substrate 80. The opening 82 is sized to allow passage of the integrated circuit die 100. In some embodiments, the opening 82 has a square shape corresponding to the size of the integrated circuit die 100. The opening 82 allows the integrated circuit die 100 to be surrounded by the substrate 80. The substrate 80 may have a thickness T1 and the integrated circuit die 100 may have a thickness T2 (FIG. 1B) measuring from the top of the interconnect structure 100-*b* to the bottom of the device layer 100-*a*. The thickness T2 may be equal, greater, or smaller than the thickness T1.

In FIGS. 1F and 1G, the substrate 80 is packaged onto a printed circuit board (PCB) 86. The substrate 80 may be bonded to the PCB 86 by a flip chip bumping process or any suitable bonding technology. In some embodiments, a plurality of conductive bumps 88 (FIG. 1G), such as conductive bumps 60, are provided on a second side 80*b* of the substrate 80. The substrate 80 is then flipped over so that the second side 80*b* of the substrate 80 is bonded to a first side 86*a* of the PCB 86, as shown in FIG. 1F. In some embodiments, the sidewall surface of the integrated circuit die 100 and the inner surface of the substrate 80 is separated by a gap 83. The gap 83 has a distance D3. Once the subsequent PCB 86 is bounded to the substrate 80, the integrated circuit die 100 is housed within a space defined by the integrated circuit die 120, the substrate 80, and the PCB 86. The height of the conductive bumps 60, 88 and difference between thickness T1 of the substrate 80 and thickness T2 of the integrated circuit die 100 together results in the gap 84 (FIG. 1G) between the integrated circuit die 100 and the PCB 86. That is, the front side 111 of the integrated circuit die 100 and a first side 86*a* of the PCB 86 is separated by the gap 84. The gap 84 has a distance D4 greater than the distance D3. The gaps 83, 84 allow air to circulate around the integrated circuit die 100. That is, the integrated circuit die 100 is exposed to air, which improves heat dissipation of the integrated circuit die 100.

Figure 7:
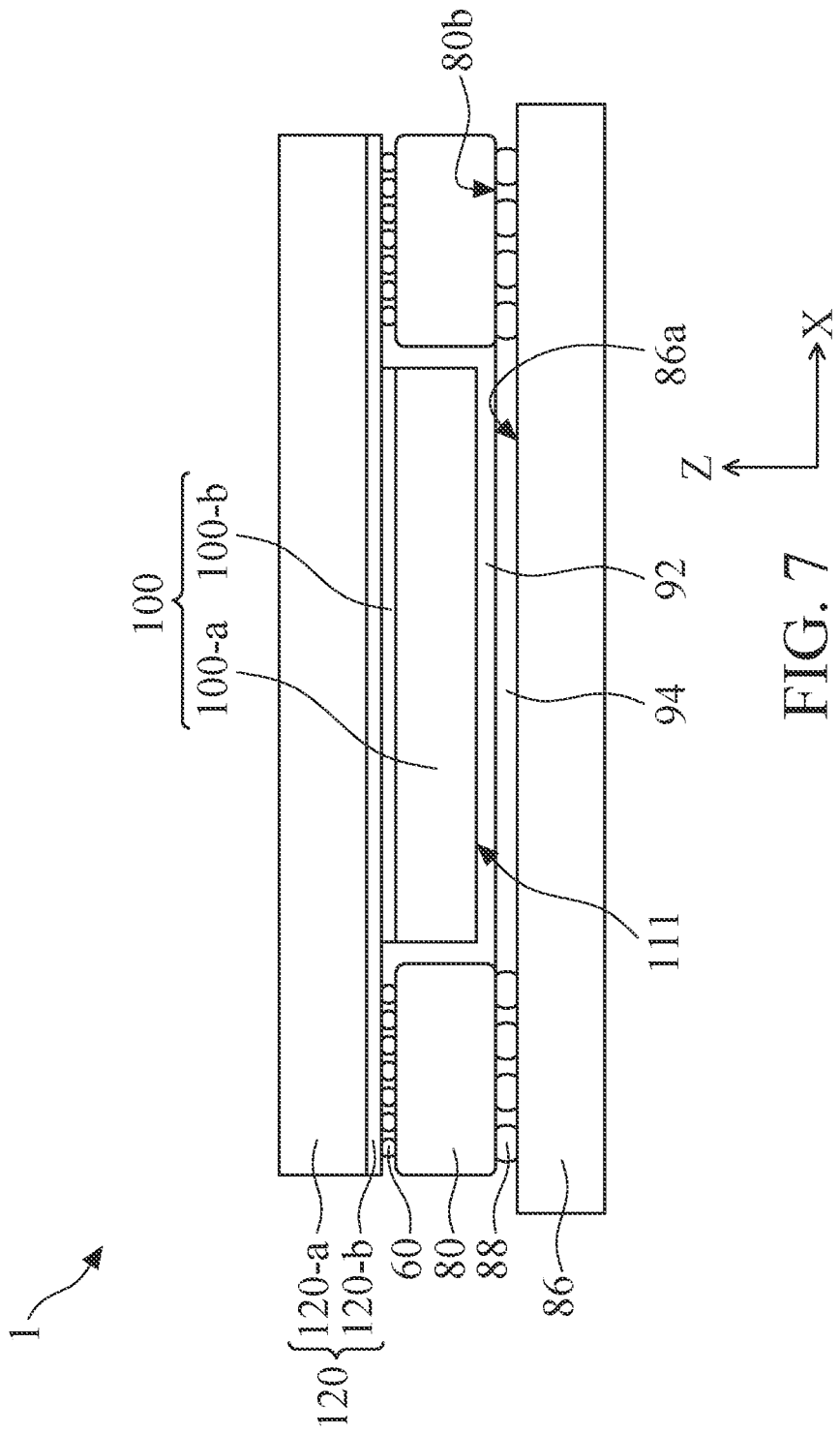
FIG. 7 is a cross-sectional view of a semiconductor package according to some embodiments of the present disclosure.

In some embodiments, an underfill material may be provided to fill the gaps 83, 84. The underfill material protects the integrated circuit die 100 and conductive bumps 60 from moisture or other environmental hazards, and strengthens the bonding between the substrate 80 and the integrated circuit die 120, as well as the bonding between the integrated circuit die 100 and the integrated circuit die 120. The underfill material may compensate for any thermal expansion difference between the integrated circuit die 100 and the substrate 80. The underfill material also serves as a shock absorbing material and protects the devices from sudden impacts. The underfill material may be polymer-based or epoxy-based and may be formed after the substrate 80 is bonded to the integrated circuit die 120 by spin coating or any suitable technique. After formation of the underfill material, a planarization process may be performed so that the get is substantially co-planar with a bottom of the substrate 80. Thereafter, the PCB 86 with the conductive bumps 88 attached thereon is bonded to the substrate 80 in a similar fashion as discussed above. FIG. 7 illustrates an embodiment where an underfill material 92 is provided to fill the volume defined by the substrate 80, the integrated circuit dies 100, 120. The underfill material 92 is in contact with the conductive bumps 60, the exposed surface of the integrated circuit dies 100, 120, and the substrate 80. Upon bonding of the PCB 86 to the substrate 80, the height of the conductive bumps 88 may result in a gap 94 defined by the underfill material 92, the conductive bumps 88, and the PCB 86. This allows the underfill material 92 to provide enhanced bonding between the integrated circuit dies 100, 120 and the substrate 80 while having the gap 94 formed for heat dissipation of the integrated circuit die 100. In some embodiments, the underfill material 92 may be formed to cover the conductive bumps 60 (and space between neighboring conductive bumps 60) only. It is contemplated that the embodiments discussed herein are applicable to the embodiments shown in FIGS. 2G and 3-6.

Embodiments of FIGS. 1A-1G provide an improved semiconductor package 1 in which the integrated circuit die 100 and the integrated circuit die 120 are attached through direct BEOL-BEOL bonding approach to enable heterogeneous integration of different dies. The integrated circuit die 100 is in electrical communication with the integrated circuit die 120, which is in electrical communication with the PCB 86 through the substrate 80. The direct BEOL-BEOL bonding and the substrate 80 ensure shorter communication distance between different integrated circuit dies and the PCB 86, which may be part of an electronic system, such as computers, wireless communication devices, computer-related peripherals, entertainment devices, or the like. The direct connection between different dies reduces interposer layers, redistribution process, and bumping processes in multi-die integration, thus, reducing cost of manufacturing while achieving higher performance.

Figure 2G:
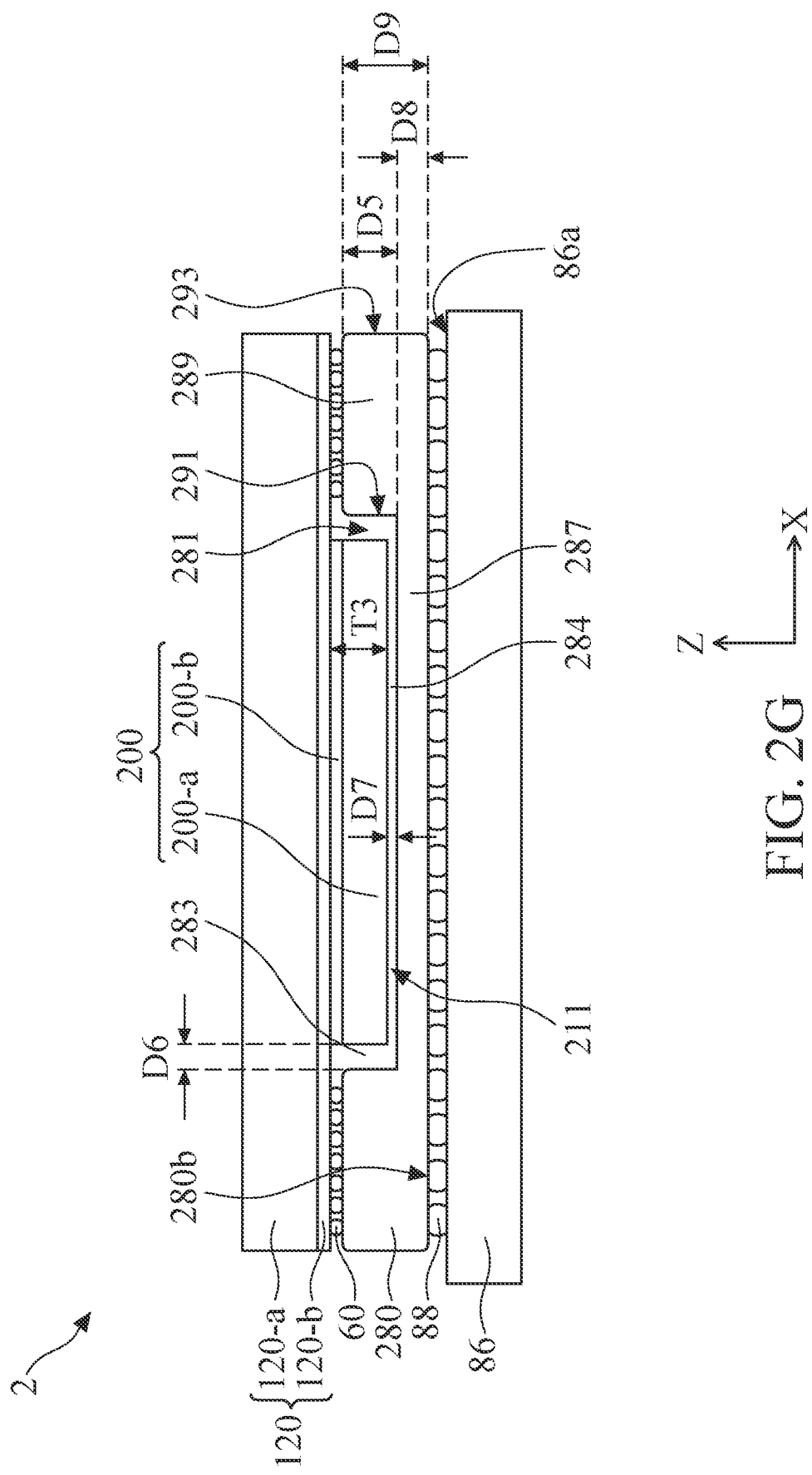

FIGS. 2A-2G schematically demonstrate various stages of forming a semiconductor package 2 according to an alternative embodiment of the present disclosure. The embodiments of FIGS. 2A-2G are substantially identical to the embodiments shown in FIGS. 1A-1G except that the substrate 80 (FIG. 1E) is replaced with a substrate without an opening 82. In FIGS. 2A-2C, a plurality of integrated circuit dies 200, such as the integrated circuit dies 100, are bounded onto the integrated circuit die 120. Similarly, each integrated circuit die 200 has a device layer 200-*a* (e.g., device layer 100-*a*) and an interconnect structure 200-*b* (e.g., interconnect structure 100-*b*) disposed on a first side of the device layer 200-*a*. The interconnect structure 200-*b* are bonded to the interconnect structure 120-*b* of the integrated circuit die 120 formed on the wafer 10, in a similar fashion as the interconnect structure 100-*b*. The wafer 10 is then cut into individual pieces. A plurality of conductive bumps 60 are provided onto the integrated circuit die 120 around the integrated circuit chip 100.

In FIG. 2D, the integrated circuit die 120 is attached to a substrate 280 by a flip chip bonding process. The integrated circuit die 120 is flipped over so that the conductive bumps 60 are facing down and bunded to a first side (front side) 280*a* of the substrate 280. FIG. 2E is a prospective view showing a second side (back side) 280*b* of the substrate 280. The substrate 280 may have a size corresponding to, larger, or smaller than the size of the wafer. The substrate 280 has an inner portion 287 and an outer portion 289 disposed coaxially outwardly of the inner portion 287. In some embodiments, the inner portion 287 and the outer portion 289 are formed as an integrated body. The inner portion 287 has a first height D8 and the outer portion 289 has a second height D9 greater than the first height D8. The inner portion 287 and the outer portion 289 therefore define a recess 281 (FIG. 2G) on the first side 280*a* of the substrate 280. The second side 280*b* of the substrate 280 is substantially flat. The substrate 280 has a plurality of conductive paths (e.g., conductive lines and/or vias) extending through the inner portion 287 and the outer portion 289. The conductive paths (e.g., conductive lines) at the inner portion 287 may extend horizontally to connect with the conductive paths (e.g., conductive vias) at the outer portion 289. Similarly, the conductive paths may have increased dimensions in different levels of the substrate 280 along the z-direction. In some embodiments, the substrate 280 includes similar conductive paths as shown in FIG. 1G'.

The outer portion 289 has an inner sidewall 291 and an outer sidewall 293 opposing the inner sidewall 291. In some embodiments, the inner sidewall 291 has a first height and the outer sidewall 293 has a second height greater than the first height. The recess 281 has a profile shaped in accordance with the integrated circuit die 200. The recess 281 has a depth D5 (FIG. 2G), which corresponds to the inner sidewall 291 of the outer portion 289, and is configured to accommodate the integrated circuit die 200. The recess 281 may be formed during or after the formation of the substrate 280 by any suitable technique. In cases where the substrate 280 is formed of polymer material, the recess 281 may be formed by covering an outer region of the substrate 280 with a mask, and removing portions of the substrate 280 not covered by the mask using suitable etching processes, such as dry etch, wet etch, or a combination thereof. The integrated circuit die 200 has a thickness T3 measuring from the top of the interconnect structure 200-b to the bottom of the device layer 200-a. The depth D5 may be equal, larger, or smaller than the thickness T3 of the integrated circuit die 200.

In FIGS. 2F and 2G, the substrate 280 is packaged onto the PCB 86. A plurality of conductive bumps 88 are provided on the second side 280b of the substrate 280. In some embodiments, the conductive bumps 88 are distributed across the second side 280b. The substrate 280 is flipped over so that the second side 280b of the substrate 280 is bonded to the first side 86a of the PCB 86 by a flip chip bumping process or any suitable bonding technology. Once the PCB 86 is bounded to the substrate 280, the integrated circuit die 200 is housed within a space defined by the integrated circuit die 120 and the substrate 280. In some embodiments, for example, the integrated circuit die 200 is enclosed within the recess 281. The sidewall surface of the integrated circuit die 200 and the inner surface of the outer portion 289 is separated by a gap 283. The gap 283 has a distance D6. The height of the conductive bumps 60 and the recess 281 together results in a gap 284 between the front side 211 of the integrated circuit die 200 and the inner portion 287 of the recess 281. In some embodiments, the gap 284 has a distance D7 smaller than the distance D6. The depth D5 of the recess 281 may be adjusted so that the distance D7 is equal or greater than the distance D6 is some embodiments. In any case, the gaps 283, 284 allow air to circulate around the integrated circuit die 200. That is, the integrated circuit die 200 is exposed to air, which improves heat dissipation of the integrated circuit die 200. In addition, since the substrate 280 has a portion extending across the entire dimension of the integrated circuit die 200, the semiconductor package 2 can be provided with better mechanical strength.

FIG. 3 illustrates a cross-sectional view of a semiconductor package 3 according to some embodiments of the present disclosure. The embodiment of FIG. 3 is substantially identical to the embodiments shown in FIGS. 1A-1G except that two integrated circuit dies 100, 300 (instead of one) are bonded onto the integrated circuit die 120. The integrated circuit dies 100, 300 may include any suitable circuit designs to achieve intended functions. For example, the integrated circuit dies 100, 300 may be a system on a chip (SOC) or a system on integrated circuit (SOIC) die; a memory die, such as a static random-access memory (SRAM) die, a dynamic random-access memory (DRAM) die, a high bandwidth memory (HBM) die, or the like; a passive device die, such as a multilayer ceramic chip (MLCC) capacitor die, an integrated passive device (IPD) die, an integrated voltage regulator (IVR) die, the like, or a combination thereof; a logic die; an analog die; a microelectromechanical system (MEMS) die, a radio frequency (RF) die, or a combination thereof. In some embodiments, the integrated circuit dies 100, 300 may be two identical SOCs or RAMs. In some embodiments, the integrated circuit dies 100, 300 may be two different SOCs or RAMs. In one exemplary embodiment, the integrated circuit die 120 is a logic die, the integrated circuit die 100 is a memory die, such as a static random-access memory (SRAM) die, a dynamic random-access memory (DRAM) die, a high bandwidth memory (HBM) die, or the like, and the integrated circuit die 300 is a SOC die.

The integrated circuit dies 100, 300 may be fabricated by providing the array of integrated circuit dies 100, 300 on the corresponding integrated circuit dies 120 formed on the wafer 10 in a suitable pattern, testing individual integrated circuit dies 100, 300, and cutting out the wafer 10 having a predetermined die combination of integrated circuit dies 100, 300. Similarly, the integrated circuit die 300 has a device layer 300-a (e.g., device layer 100-a) and an interconnect structure 300-b (e.g., interconnect structure 100-b) disposed on a first side of the device layer 300-a. The interconnect structures 100-b, 300-b are bonded to the interconnect structure 120-b of the integrated circuit die 120, in a similar fashion as the interconnect structure 100-b discussed above. The integrated circuit dies 100, 300 may be separated from each other by a gap 384.

Although the integrated circuit die 100 and integrated circuit die 300 appear to have the same height and surface area as shown in FIG. 3, the thickness/height and/or size of the integrated circuit die 100 may be different from the thickness/height and/or surface area of the integrated circuit die 300. In some embodiments, the thickness T2 of the integrated circuit die 100 is different than the thickness T4 of the integrated circuit die 300. The thickness T4 may be less, greater than the thickness T2.

FIG. 4 illustrates a cross-sectional view of a semiconductor package 4 according to some embodiments of the present disclosure. The embodiment of FIG. 4 is substantially identical to the embodiments shown in FIGS. 2A-2G except that two integrated circuit dies 200, 400 (instead of one) are bonded onto the integrated circuit dies 120. The integrated circuit dies 200, 400 may be substantially identical to the integrated circuit dies 100, 300 except that the thickness T5, T6 of the integrated circuit dies 200, 400 is less than that of the integrated circuit dies 100, 300, respectively, due to the space defined by the recess 281. The integrated circuit dies 200, 400 may include any suitable circuit designs to achieve intended functions. In some embodiments, the integrated circuit dies 200, 400 may be two identical SOCs or RAMs. In some embodiments, the integrated circuit dies 200, 400 may be two different SOCs or RAMs. In one exemplary embodiment, the integrated circuit die 120 is a logic die, the integrated circuit die 200 is a memory die, such as a static random-access memory (SRAM) die, a dynamic random-access memory (DRAM) die, a high bandwidth memory (HBM) die, or the like, and the integrated circuit die 400 is a SOC die.

Similarly, the integrated circuit die 400 has a device layer 400-a (e.g., device layer 100-a) and an interconnect structure 400-b (e.g., interconnect structure 100-b) disposed on a first side of the device layer 400-a. The interconnect structures 400-b and 100-b are bonded to the interconnect structure 120-b, in a similar fashion as the interconnect structure 100-b. The integrated circuit dies 200, 400 are enclosed within the recess 281 and may be separated from each other by a gap 484. Therefore, the integrated circuit dies 200, 400 are exposed to air. In some embodiments, the gap 484 is filled up with underfill material (e.g., underfill material 92 shown in FIG. 7). The underfill protects the integrated circuit dies 200, 400 and conductive bumps 60 from moisture or other environmental hazards, and provides additional mechanical strength to the semiconductor package 4 as well as compensates for any thermal expansion difference between the integrated circuit dies 200, 400, and the substrate 280. In such cases, the underfill material is in contact with the exposed surfaces of the integrated circuit dies 120, 200, 400 as well as the substrate 80.

Although the integrated circuit die 200 and integrated circuit die 400 appear to have the same height and surface area as shown in FIG. 3, the thickness/height and/or size of the integrated circuit die 200 may be different from the thickness/height and/or surface area of the integrated circuit die 400. In some embodiments, the thickness T5 of the integrated circuit die 200 is different than the thickness T6 of the integrated circuit die 400. The thickness T5 may be less, greater than the thickness T6. The depth D5 of the recess 281 may be equal, larger, or smaller than the thickness T5 and/or T6.

FIG. 5 is a cross-sectional view of a semiconductor package 5 according to some embodiments of the present disclosure. Embodiments of FIG. 5 are substantially identical to the embodiments shown in FIG. 3 except that three integrated circuit dies 100, 300, 500 (instead of two) are bonded onto the integrated circuit die 120. The integrated circuit dies 100, 300, 500 may include any suitable circuit designs to achieve intended functions. In some embodiments, the integrated circuit dies 100, 300, 500 may be three identical SOCs or RAMs. In some embodiments, the integrated circuit dies 100, 300, 500 may be three different SOCs or RAMs. In one exemplary embodiment, the integrated circuit die 120 is a logic die, the integrated circuit die 100 is a memory die, such as a static random-access memory (SRAM) die, a dynamic random-access memory (DRAM) die, a high bandwidth memory (HBM) die, or the like, the integrated circuit dies 300, 500 are a SOC die.

The integrated circuit dies 100, 300, 500 may be fabricated by providing the array of integrated circuit dies 100, 300, 500 on the corresponding integrated circuit dies 120 formed on the wafer 10 in a suitable pattern, testing individual integrated circuit dies 100, 300, 500, and cutting out the wafer 10 having a predetermined die combination of integrated circuit dies 100, 300, 500. Similarly, the integrated circuit die 500 has a device layer 500-a (e.g., device layer 100-a) and an interconnect structure 500-b (e.g., interconnect structure 100-b) disposed on a first side of the device layer 500-a. The interconnect structure 500-b are bonded to the interconnect structure 120-b, in a similar fashion as the interconnect structure 100-b. The integrated circuit dies 100, 300, 500 may be separated from each other by gap 584a, 584b. Therefore, the integrated circuit dies 100, 300, 500 are exposed to air. Although the integrated circuit dies 100, 300, 500 appear to have the same height and surface area, the thickness/height and/or size of the integrated circuit die 100 may be different from the thickness/height and/or surface area of the integrated circuit die 300 and/or 500. In some embodiments, the thickness T7 of the integrated circuit die 500 is different than the thickness T2 and/or T4 of the integrated circuit die 100, 300. The thickness T7 may be less, greater than the thickness T2 and/or T4.

FIG. 6 is a cross-sectional view of a semiconductor package 6 according to some embodiments of the present disclosure. Embodiments of FIG. 6 are substantially identical to the embodiments shown in FIG. 4 except that three integrated circuit dies 200, 400, 600 (instead of two) are bonded onto the integrated circuit die 120. The integrated circuit dies 200, 400, 600 may be substantially identical to the integrated circuit dies 100 except that the thickness T5, T6, T8 of the integrated circuit dies 200, 400, 600 is less than that of the integrated circuit dies 100, due to the limited space defined by the recess 281. In some embodiments, the integrated circuit dies 200, 400, 600 may be three identical SOCs or RAMs. In some embodiments, the integrated circuit dies 200, 400, 600 may be three different SOCs or RAMs. In one exemplary embodiment, the integrated circuit die 120 is a logic die, the integrated circuit die 200 is a memory die, such as a static random-access memory (SRAM) die, a dynamic random-access memory (DRAM) die, a high bandwidth memory (HBM) die, or the like, and the integrated circuit dies 400, 600 are a SOC die.

The integrated circuit dies 200, 400, 600 may be fabricated by providing the array of integrated circuit dies 200, 400, 600 on the corresponding integrated circuit dies 120 formed on the wafer 10 in a suitable pattern, testing individual integrated circuit dies 200, 400, 600, and cutting out the wafer 10 having a predetermined die combination of integrated circuit dies 200, 400, 600. Similarly, the integrated circuit die 600 has a device layer 600-a (e.g., device layer 100-a) and an interconnect structure 600-b (e.g., interconnect structure 100-b) disposed on a first side of the device layer 600-a. The interconnect structure 600-b are bonded to the interconnect structure 120-b, in a similar fashion as the interconnect structure 100-b. The integrated circuit dies 200, 400, 600 are enclosed within the recess 281 and may be separated from each other by gap 684a, 684b. Therefore, the integrated circuit dies 200, 400, 600 are exposed to air. Although the integrated circuit dies 200, 400, 600 appear to have the same height and surface area, the thickness/height and/or size of the integrated circuit die 600 may be different from the thickness/height and/or surface area of the integrated circuit die 200 and/or 400. In some embodiments, the thickness T8 of the integrated circuit die 600 is different than the thickness T5 and/or T6 of the integrated circuit die 200, 400. The thickness T8 may be less, greater than the thickness T5 and/or T6. The depth D5 of the recess 281 may be equal, larger, or smaller than the thickness T5, T6, and/or T8.

Various embodiments of the present disclosure provide improved semiconductor packages in which one or more integrated circuit dies are bonded together through direct BEOL-BEOL bonding approach to enable heterogeneous integration of different dies. Comparing to InFO_PoP (Integrated Fan-Out package on package) and FC_PoP (Flip-Chip package on package) technologies, the direct BEOL-BEOL bonding of different integrated circuit dies ensure shorter communication distance between different integrated dies and PCB. The use of a substrate disposed between and bonded directly with the integrated circuit die and the PCB eliminates interposer layers, redistribution process, and bumping processes in multi-die integration, thus, reducing cost of manufacturing while achieving higher performance. In addition, lower power consumption and higher bandwidth can also be achieved compared to other 3D IC packaging technologies. Furthermore, semiconductor packages fabricated using inventive concept allow easier thermal management compared to other 3D IC packaging technologies since no thick copper or plastic material is needed and the integrated circuit dies are exposed to air circuiting around the integrated circuit dies due to an opening or recess formed in the substrate. As a result, no package warpage issue is observed.

In one embodiment, a semiconductor package is provided. The semiconductor package includes a first integrated circuit die having a first circuit design, and the first integrated circuit die comprises a first device layer and a first interconnect structure. The semiconductor package also includes a second integrated circuit die having a second circuit design different than the first circuit design, and the second integrated circuit die comprises a second device layer and a second interconnect structure having a first side in contact with the first device layer and a second side in direct contact with the first interconnect structure of the first integrated circuit die. The semiconductor package further includes a substrate having a first side bonded to the first interconnect structure, wherein the second integrated circuit die is surrounded by at least a portion of the substrate.

In another embodiment, a semiconductor package is provided. The semiconductor package includes a first integrated circuit die having a first interconnect structure and a substrate having a first side and a second side opposing the first side. The first side of the substrate is in electrical contact with the first interconnect structure of the first integrated circuit die, and the substrate includes an inner sidewall and an outer sidewall opposing the inner sidewall. The semiconductor package also includes a second integrated circuit die having a second interconnect structure in electrical contact to the first interconnect structure of the first integrated circuit, wherein the second integrated circuit die is surrounded by the inner sidewall of the substrate.

In yet another embodiment, a semiconductor package is provided. The semiconductor package includes a first integrated circuit die having a first interconnect structure, a substrate having a first side and a second side opposing the first side, wherein the first side of the substrate is bonded to the first interconnect structure of the first integrated circuit die, and the substrate has a through opening having a first dimension. The semiconductor package also includes a second integrated circuit die having a second interconnect structure bounded to the first interconnect structure of the first integrated circuit, wherein the second integrated circuit die has a second dimension less than the first dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor package, comprising:
 a first integrated circuit die having a first circuit design, and the first integrated circuit die comprises:
  a first device layer; and
  a first interconnect structure;
 a second integrated circuit die having a second circuit design different than the first circuit design, and the second integrated circuit die comprises:
  a second device layer; and
  a second interconnect structure having a first side in contact with the second device layer and a second side in direct contact with the first interconnect structure of the second integrated circuit die;
 a substrate having a first side bonded to the first interconnect structure, wherein the substrate has an opening extending through entire thickness of the substrate, and the second integrated circuit die is surrounded by at least a portion of the substrate in the opening.

2. The semiconductor package of claim 1, further comprising:
 a third integrated circuit die, comprising:
  a third device layer; and
  a third interconnect structure having a first side in contact with the third device layer and a second side in direct contact with the first interconnect structure of the first integrated circuit die.

3. The semiconductor package of claim 2, wherein the substrate is a ring-like substrate and the second and third integrated circuit dies are surrounded by the substrate.

4. The semiconductor package of claim 1, wherein the substrate has a recess and the second integrated circuit die is surrounded by the recess.

5. The semiconductor package of claim 1, wherein the substrate further comprises:
 a first conductive path disposed in the substrate adjacent a first side of the substrate, the first conductive path having a first diameter; and
 a second conductive path disposed in the substrate adjacent a second side of the substrate opposing the first side, wherein the second conductive path is in electrical connection with the first conductive path, and the second conductive path has a second diameter greater than the first diameter.

6. The semiconductor package of claim 2, wherein the second and the third integrated circuit dies have different heights.

7. The semiconductor package of claim 1, further comprising:
 an underfill material in contact with the portions of the second integrated circuit die and the substrate.

8. The semiconductor package of claim 7, wherein the underfill material is further in contact with exposed surfaces of the first integrated circuit die.

9. The semiconductor package of claim 8, further comprising:
 a printed circuit board bonded to a second side of the substrate, wherein the printed circuit board and the underfill material define a gap therebetween.

10. The semiconductor package of claim 1, further comprising:
 a plurality of conductive bumps disposed between the substrate and the first interconnect structure; and
 an underfill material in contact with exposed surfaces of the plurality of conductive bumps.

11. A semiconductor package, comprising:
 a first integrated circuit die having a first interconnect structure;
 a substrate having a first side and a second side opposing the first side, the first side of the substrate in contact with the first interconnect structure of the first integrated circuit die, and the substrate comprising an inner sidewall and an outer sidewall opposing the inner sidewall;

a printed circuit board bonded to the second side of the substrate; and a second integrated circuit die having a second interconnect structure in contact with the first interconnect structure of the first integrated circuit, wherein a sidewall of the second integrated circuit die is separated from the inner sidewall of the substrate by a first distance, and a bottom surface of the second integrated circuit is exposed to and separated from the printed circuit board by a second distance that is different than the first distance.

12. The semiconductor package of claim 11, wherein at least a portion of the second integrated circuit die is exposed to air.

13. The semiconductor package of claim 12, wherein the substrate is a ring-like substrate.

14. The semiconductor package of claim 11, further comprising:

a third integrated circuit die having a third interconnect structure in contact with the first interconnect structure of the first integrated circuit die, wherein the second and the third integrated circuit dies have different heights.

15. The semiconductor package of claim 11, further comprising:

an underfill material in contact with exposed surfaces of the first and second interconnect structures and the substrate, and at least a portion of the underfill material is surrounded by the inner sidewall of the substrate.

16. The semiconductor package of claim 15, wherein a portion of the underfill material is further in contact with the sidewall of the second integrated circuit die.

17. The semiconductor package of claim 15, wherein the substrate further comprises:

a first conductive path disposed in a first portion adjacent the first side of the substrate, the first conductive path having a first diameter; and a second conductive path disposed in a second portion adjacent the second side of the substrate opposing the first side, wherein the second conductive path is in electrical connection with the first conductive path, and the second conductive path has a second diameter greater than the first diameter.

18. A semiconductor package, comprising:

a first integrated circuit die having a first interconnect structure;

a substrate having a first side and a second side opposing the first side, the first side of the substrate being bonded to the first interconnect structure of the first integrated circuit die, and the substrate has a through opening having a first dimension; and a second integrated circuit die having a second interconnect structure bounded to the first interconnect structure of the first integrated circuit, wherein the second integrated circuit die has a second dimension less than the first dimension to allow passage of the second integrated circuit in the through opening from the first side to the second side of the substrate.

19. The semiconductor package of claim 18, wherein the second integrated circuit die is disposed within the through opening, and the second integrated circuit is separated from the substrate by a first gap.

20. The semiconductor package of claim 19, further comprising:

a printed circuit board bonded to the second side of the substrate, wherein the second integrated circuit die is separated from the printed circuit board by a second gap that is greater than the first gap.

* * * * *